(12) United States Patent
Markman

(10) Patent No.: US 7,149,952 B2
(45) Date of Patent: Dec. 12, 2006

(54) MEMORY MANAGEMENT ALGORITHM FOR TRELLIS DECODERS

(75) Inventor: Inonete Markman, Carmel, IN (US)

(73) Assignee: Thomson Licensing, Boulogne-Billancourt (FR)

( * ) Notice: Subject to any disclaimer, the term of this patent is extended or adjusted under 35 U.S.C. 154(b) by 0 days.

(21) Appl. No.: 10/511,655

(22) PCT Filed: Mar. 10, 2003

(86) PCT No.: PCT/US03/07166

§ 371 (c)(1),
(2), (4) Date: Oct. 18, 2004

(87) PCT Pub. No.: WO03/090361

PCT Pub. Date: Oct. 30, 2003

(65) Prior Publication Data
US 2005/0257123 A1 Nov. 17, 2005

Related U.S. Application Data

(60) Provisional application No. 60/373,246, filed on Apr. 17, 2002.

(51) Int. Cl.
  G03M 13/03 (2006.01)
(52) U.S. Cl. .................................................. 714/792
(58) Field of Classification Search ................ 375/341; 714/792
  See application file for complete search history.

(56) References Cited

U.S. PATENT DOCUMENTS

| 5,712,880 | A | * | 1/1998 | Rim et al. .................. 375/341 |
| 5,796,756 | A | * | 8/1998 | Choi et al. ................... 714/795 |
| 5,841,478 | A | | 11/1998 | Hu et al. |
| 6,094,739 | A | * | 7/2000 | Miller et al. ................. 714/792 |
| 6,134,697 | A | * | 10/2000 | Jekal ........................... 714/792 |
| 6,560,749 | B1 | * | 5/2003 | Cohen ......................... 714/792 |
| 6,775,334 | B1 | * | 8/2004 | Liu et al. ..................... 375/341 |
| 2004/0054957 | A1 | * | 3/2004 | Luetkemeyer ............... 714/794 |
| 2005/0141629 | A1 | * | 6/2005 | Markman ..................... 375/265 |

OTHER PUBLICATIONS

Hu et al. "A Viterbi Decoder Memory Management System Using Forward Traceback and All-path Traceback", Int'l Conference on Consumer Electronics, 1999, ICCE, Jun. 24, 1999, pp. 68-69.

* cited by examiner

Primary Examiner—Albert Decady
Assistant Examiner—Sam Rizk
(74) Attorney, Agent, or Firm—Joseph J. Laks; Ronald H. Kurdyla

(57) ABSTRACT

An improved all-path traceback/forward trace system for use in managing the memory used in processing decoded survivor sequences produced by a trellis decoder network. The memory size is decreased to T*N, where T is a predetermined survivor memory depth and N is the number of states in the trellis. The latency value of the present system is equal to T. Both the memory requirement and latency value represent a 33% decrease in the value of similar parameters produced in a prior art APTFT system. An existing forward trace/path selection unit is modified to take advantage of the inherent nature of the forward trace process in order to simplify the decoding system. A generalized version of the APTFT system permits greater flexibility in the choice of memory size and latency values needed to satisfy the requirements of a particular decoding system.

26 Claims, 5 Drawing Sheets

|  | Buffer | Traceback | Decoded Seq. Memory | Forward Trace |
|---|---|---|---|---|
| Epoch 1 | Read D0* Write D1 | BT D0* | Read DD-1 Write DD0* | FT D1 |
| Epoch 2 | Read D1* Write D2 | BT D1* 20 | Read DD0 Write DD1* | FT D2 18 |
| Epoch 3 | Read D2* Write D3 | BT D2* | Read DD1 Write DD2* 19 | FT D3 22 |
| Epoch 4 | Read D3* Write D4 | BT D3* | Read DD2 Write DD3* | FT D4 |
| Epoch 5 | Read D4* Write D5 | BT D4* | Read DD3 Write DD4* | FT D5 |

Di = data in epoch i       BT = traceback       FT = forward trace

DDi = decoded data from epoch i       * = reverse time order

Fig. 4

|         | Buffer | Traceback | Decoded Seq. Memory | Forward Trace |
|---------|--------|-----------|---------------------|---------------|
| Epoch 1 | Read D0* Write D1 | BT D0* | Read DD-q+1 Write DD0* | FT D1 |
| Epoch 2 | Read D1* Write D2 | BT D1* | Read DD-q+2 Write DD1* 29 | FT D2 |
| ⋮ | | | | |
| Epoch q | Read Dq-1* Write Dq | BT Dq-1* | Read DD0 Write DDq-1* | FT Dq 28 |
| Epoch q+1 | Read Dq* Write Dq+1 | BT Dq* | Read DD1 Write DDq* 30 | FT Dq+1 |

Di = data in epoch j    BT = traceback    FT = forward trace

DDi = decoded data from epoch j    * = reverse time order

Fig. 6

MEMORY MANAGEMENT ALGORITHM FOR TRELLIS DECODERS

This application claims the benefit, under 35 U.S.C. § 365 of International Application PCT/US03/07166, filed Mar. 10, 2003, which was published in accordance with PCT Article 21(2) on Oct. 30, 2003 in English and which claims the benefit of United States Provisional Patent Application No. 60/373,246, filed Apr. 17. 2002.

BACKGROUND OF THE INVENTION

1. Field of the Invention

This invention relates generally to the field of digital signal processing and more particularly to signal decoders designed to store selected sequences from which a decoded sequence is ultimately retrieved.

2. Background of the Invention

Communications systems such as High Definition Television (HDTV) employ trellis encoding to protect against interference from particular noise sources. Trellis coding requirements for HDTV are presented in sections 4.2.4–4.2.6 (Annex D), 10.2.3.9, 10.2.3.10 and other sections of the Digital Television Standards for HDTV Transmission of Apr. 12, 1995 prepared by the Advanced Television Systems Committee (ATSC). The trellis decoder selects a received symbol sequence as the most likely to be correct, that is, the survivor sequence, according to a signal processing algorithm. The most popular trellis decoding algorithm is the Viterbi algorithm, as described in the paper entitled Convolutional Codes and Their Performance in Communication Systems, by A. J. Viterbi, published in the I.E.E.E. Transactions on Communications Technology, vol. COM-19, 1971, pp. 751–772. In the Viterbi algorithm, there are two widely known techniques for the storage of the survivor sequences from which the decoded sequence is ultimately retrieved. One technique is known as register exchange and the other technique is known as traceback. The theory behind the traceback process is described in Architectural Tradeoffs for Survivor Sequence Memory Management in Viterbi Decoders by G. Feygin et al. published in the I.E.E.E. Transactions on Communications, vol. 41, no. 3, March, 1993. Although relatively simple, the register exchange method requires large power consumption and large area in VLSI implementations, and is therefore restricted to codes having small constraint length. Constraint length is defined as $K=v+k$, where v is the number of memory elements in the trellis encoder and the code rate is $R=k/n$. Thus, traceback is the preferred method in the design of moderate to large constraint length trellis decoders.

U.S. Pat. No. 5,841,478, entitled CODE SEQUENCE DETECTION IN A TRELLIS DECODER, issued Nov. 24, 1998 to Hu et al., discloses an all-path traceback network coupled to an all-path trace forward network for the selection of the survivor sequence. The described traceback process is performed to a predetermined depth T, the traceback depth or survivor memory depth, in order to identify a predetermined number of antecedent trellis states. In practice, the traceback interval T is chosen to provide a sufficient period to permit identification of a merged or converged state. The merged state identifies the data sequence with the greatest likelihood of being the true encoded data. The merged state is the trellis decoded data sequence that is selected as the final output data, chosen from among the several candidate sequences. This traceback process is performed in two stages for traceback intervals of T/2, known as epochs. The selection of such epochs or traceback subintervals is arbitrary and selectable by the system designer.

The overall memory size required in Hu et al. scheme is $3/2*T*N$, where T is the predetermined survivor memory depth and N is the number of states in the trellis. In order to achieve satisfactory decoder performance, the survivor memory depth or traceback depth (or traceback interval) T is typically four to six times the code constraint length. The value of N is equal to 2v, where v is the number of memory elements in the encoder. The latency, or data decoding delay, associated with the Hu et al. algorithm is $3/2*T$. While the Hu et al. device was implemented in an ATSC HDTV trellis decoder, which required twelve interleaved decoders, the disclosed technique can be applied to any trellis decoder. Unfortunately, the Hu et al. system is not the most efficient traceback algorithm, and is not as efficient as the register exchange technique with respect to memory size and data decoding delay, or latency. However, it is more efficient than the register exchange algorithm in power consumption and control complexity, as any traceback algorithm would be.

The Hu et al. all-path traceback/forward trace (APTFT) system can be described by the block diagram of FIG. 1. The data input 16 to the system consists of a trellis decoder Add-Compare-Select (ACS) unit output per trellis state and per trellis branch, that is, a pointer to the previous state in the trellis. The control inputs consist of clock, enable, reset, any sync signals, and the minimum state per trellis branch. The minimum state per trellis branch is also an ACS output which identifies the state having the minimum path metric (value) at each trellis branch. The control unit generates all of the control signals and read/write addressing of the various memory blocks.

The buffer is a Last In, First Out (LIFO) memory of size $(T/2)*N$, which temporarily stores the ACS output. Data is written in order of arrival, N states at a time, and is read in reverse order during the following epoch. An epoch is characterized by the size of the buffer memory in input samples (trellis branches), that is, T/2 samples. After each read operation, a new data input is written in the same location.

The all-path traceback unit is directed by the control unit to read the buffer memory from the previous epoch, in the reverse order of storage, and trace back through the trellis for an entire epoch of T/2 samples at a time. As it traces back through the trellis, the all-path traceback unit sends a decoded output to the decoded sequence memory for each of the N states in the trellis. The all-path traceback unit therefore needs N state pointers to identify the N surviving paths in the trellis. The N state pointers are updated for every branch and always point to the previous state in the corresponding path. At the same time that the all-path traceback unit is reading and processing the ACS data 16, which had been buffered on the previous epoch, the forward trace unit is tracing forward through the trellis with the ACS data 16 of the current epoch.

The activities of the various units during each new epoch are depicted in the timing diagram of FIG. 2. The input data is written into the buffer memory in normal, forward order and is passed to the all-path traceback unit in reverse order. The decoded output of the all-path traceback unit, for all of the trellis states, is then passed to the decoded sequence memory. This decoded information is read from the decoded sequence memory two epochs later in reverse order. The two reverse read operations cancel each other, causing the final decoded data to appear in the correct forward order. The two epoch delay in the decoded sequence memory unit necessarily requires a memory size of $T*N$.

At the end of each epoch, the path selection unit updates and freezes the value of the forward trace pointer, P, associated with the minimum state path sent by the ACS unit. This pointer is used for a period of one epoch until the next update occurs. At the boundary of an epoch, the forward trace pointer points to the minimum state path and provides the state associated with this path two epochs earlier. However, as the end of the epoch approaches, the forward state pointer points to the minimum state path at the previous epoch boundary and provides the state associated with this path three epochs earlier. The Hu et al. device actually has two internal pointers (P1 and P2) for each state path which are temporally offset from each other by one epoch. These two pointers will ultimately help identify the trellis decoded bit sequences. The pointer P1 for each state path is updated for every branch with forward trace information, while the pointer P2 is only updated once every epoch. Pointer P1 is the current epoch pointer and pointer P2 is the immediately prior epoch pointer.

Since N states have N survivor state paths, there are 2*N internal pointers in the forward trace unit. At the end of each epoch, each internal pointer points to the beginning state of the same epoch in the corresponding survivor path. These pointers contribute to create the main pointer P. At the end of an epoch, the pointer P2 receives the value of pointer P1 and then P1 is reset and initiates a forward trace through the trellis during the following epoch. The multiplexer unit uses the forward trace pointer, P, to select one of the N decoded sequences from the decoded sequence memory and to forward the selected decoded bit(s) as its output.

For example, at the end of epoch 3, the forward trace pointer, P, indicates the trellis state associated with the beginning of epoch 2 in the minimum path. The pointer P1 points from the ending state to the beginning state of epoch 3, and the pointer P2 points from the ending state to the beginning state of epoch 2. The pointer P2 is then updated with the value of pointer P1, and pointer P1 is then reset. During epoch 4, the value of pointer P is unchanged and points to the beginning state of epoch 2, and this value will be used by the multiplexer to select the appropriate decoded sequence DD1 in FIG. 2, that is being read from the decoded sequence memory out of the N possible sequences. The pointer P2 is frozen or unchanged during epoch 4 and points to the beginning state of epoch 3. The pointer P1 is continuously updated with the forward trace during epoch 4. Similarly, at the end of epoch 4, the forward trace pointer P is updated to point to the beginning state of epoch 3, pointer P2 is updated to point to the beginning state of epoch 4, and pointer P1 is reset. During the entirety of epoch 5, the pointer P selects the correct decoded sequence DD2 in FIG. 2, which is being read from the decoded sequence memory. This process continues indefinitely as long as an input signal is available to be processed.

As best understood with reference to FIG. 2, the forward trace will process data up to data D3 (data in epoch 3) in order to permit decoding of the data associated with D1, the decoded data being data DD1 (decoded data from epoch 1), which will occur during epoch 4. Therefore, three epochs are fully processed (epochs 2 and 3 by the forward trace and epoch 1 by the traceback) before the first epoch decoded data DD1 is generated as an output signal. Similarly, in order to output DD2 (decoded data from epoch 2), two epochs (epochs 3 and 4) are processed by the forward trace and one epoch (epoch 2) is processed by the traceback, the process continuing as a sliding window of three epochs at a time. This process implies that the first bit of DD1 has a corresponding survivor memory depth of three epochs or $3/2*T$ samples, since the first decoded bit is associated with the beginning of epoch 1 and the pointer P is associated with the end of epoch 3. In contrast, the last bit of DD1 has a survivor memory depth of two epochs, or T, since the last decoded bit is associated with the end of epoch 1 and the pointer P is associated with the end of epoch 3. Similarly, the first bit of DD2 is associated with a survivor memory depth of $3/2*T$, and the last bit of DD2 is associated with a survivor memory depth of T. This guarantees that any decoded sequence block (DD1, DD2, DD3 . . . ) is associated with a survivor memory depth of at least T.

As the data is processed and decoded by the All-Path Traceback/Forward Trace(APTFT) processor, the memory size will consist of $T/2*N$ in the buffer memory plus $T*N$ in the decoded sequence memory, corresponding to a total of $3/2*T*N$. Additionally, the Hu et al. algorithm needs a total of $3*N+1$ state pointers (N in the all-path traceback unit and $2*N+1$ in the forward trace unit, that is, pointer P, N pointers P1 and N pointers P2). The data decoding delay, or latency, in the Hu et al. device is attributable to a one epoch delay (T/2 samples) in the buffer memory, plus a two epoch delay (T samples) in the decoded sequence memory. The total latency is thus a three epoch delay, or $3/2*T$ samples.

In order to decode a sequence with a survivor memory depth of T, an efficient algorithm will have the characteristic that each bit has an associated survivor memory depth of T. Existing traceback algorithms need to decode entire data blocks per processing cycle with the result that unnecessarily large survivor memory depth exists for all but one bit in the data block. Thus a need exists for an improved trellis decoder memory management scheme in which both memory size and latency values are reduced.

BRIEF SUMMARY OF THE INVENTION

The present invention is a trellis decoder system employing an All-Path Traceback/Forward Trace (APTFT) algorithm that reduces memory and latency requirements with respect to the prior art APTFT algorithm. In particular, the present invention discloses a trellis decoder system requiring a memory size of T*N (survivor memory depth times the number of trellis states) and a latency of T, representing a reduction of one third for both parameters without any increase in control requirements and while maintaining the same survivor memory depth T. This improvement permits the APTFT algorithm to become one of the most efficient traceback techniques. Further, the APTFT algorithm becomes competitive with register exchange algorithms for codes having a small constraint length. The present invention also includes a generalization of the APTFT algorithm which permits greater flexibility in the choice of memory size and latency to satisfy the needs of a particular system.

The present invention can be applied to any trellis decoder system or similar signal processing technique which needs to store and process survivor sequences in order to ultimately generate a decoded or other regimented output sequence. The system may be generalized to one or multiple decoders, concatenated or non-concatenated decoders, decoders with parallel or distributed processing, multiple decoders which are either parallel or serial, interleaved or non-interleaved decoders, and to any type of similar signal processing scheme.

BRIEF DESCRIPTION OF THE DRAWING

FIG. 4 is a timing diagram showing relationships of data being processed according to the flow chart of FIG. 3;

FIG. 6 is a timing diagram of showing relationships of data being processed according to a generalized embodiment of the present invention.

DETAILED DESCRIPTION OF THE INVENTION

Figures 1, 2:
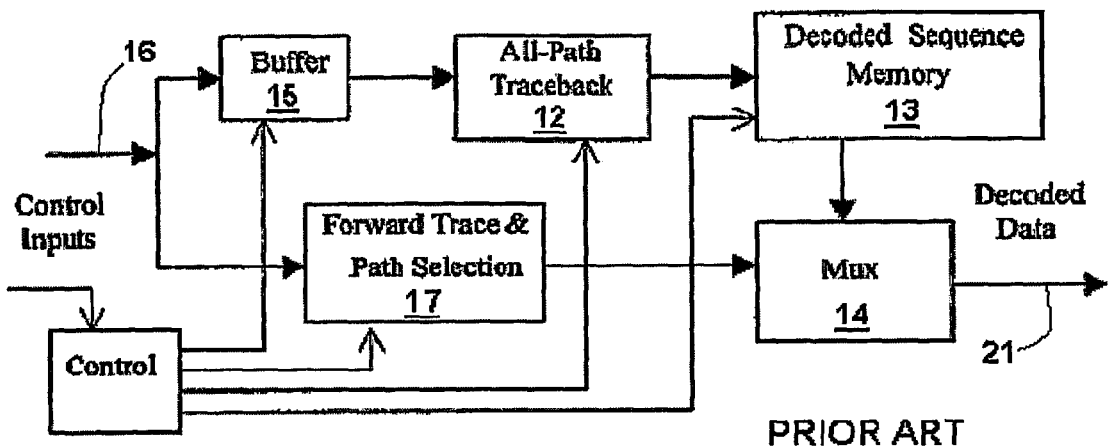
FIG. 1 is a simplified block diagram of a prior art All-Path Traceback/Forward Trace (APTFT) system.
FIG. 2 is a timing diagram of a prior art APTFT system depicted in FIG. 1.

Referring to FIG. 1, the simplified block diagram of the prior art All-Path Traceback/Forward Trace(APTFT) system permits an understanding of the present invention. The functional blocks depicted in FIG. 1 perform in the same manner for the purposes of the present invention with the exception of the Forward Trace & Path Selection unit 17. The present invention exploits the characteristics of the forward trace to simplify operation of the prior system. As earlier mentioned, at the conclusion of each epoch the Forward Trace & Path Selection unit updates and freezes the forward trace pointer, P, which is associated with the minimum trellis path state sent by the Add-Compare-Select (ACS) unit. The pointer P is then used for the entire duration of an epoch to select the optimum decoded sequence from the decoded sequence memory. As a result, the first decoded bit of an epoch is associated with a survivor memory depth of 3/2*T, and the last decoded bit is associated with a survivor memory depth of T.

In the present invention, at the conclusion of each epoch the forward trace pointer, P, is not frozen, but is instead allowed to continuously update its value throughout the decoding process. As earlier stated, pointer P1 is continuously updated by the forward trace during an epoch while the pointer P2 is only updated at the end of an epoch. Both pointers P1 and P2 for each trellis state, together with the minimum path value received from the ACS unit, contribute to create the value of pointer P. By continuously updating pointer P for every data sample, the value of pointer P will reflect the continuously updated value of pointer P1 and therefore reflect the continuous forward trace process through the trellis. In this manner the survivor memory depth is a sliding window of constant size T propagating through the trellis.

As a result of continuously updating the value of pointer P, the decoded sequence memory, which receives the decoded data sequences from the all-path traceback unit 12 for all of the trellis states, needs to make its data available to the multiplexer 14 one epoch later rather than two epochs later. The one epoch delay requires a memory size of (T/2)*N, rather than T*N (for a two epoch delay), thereby permitting a fifty percent decrease in the size of the decoded sequence memory 13.

As the data 16 is processed and decoded by the modified APTFT processor just described, the memory size will consist of (T/2)*N for the buffer memory 15, plus (T/2)*N for the decoded sequence memory 13, corresponding to a total memory requirement of T*N. Further, there is a one epoch delay (T/2 samples) attributable to the buffer memory 15 and a one epoch delay (T/2 samples) attributable to the decoded sequence memory 13, resulting in a total latency that is equal to a two epoch delay (T samples). The modified APTFT processor of the present invention requires a total of 3*N+1 trellis state pointers based on N pointers in the all-path traceback unit 12 and 2*N+1 pointers in the forward trace unit 17, that is, pointer P, N pointers P1 and N pointers P2.

Figure 3:
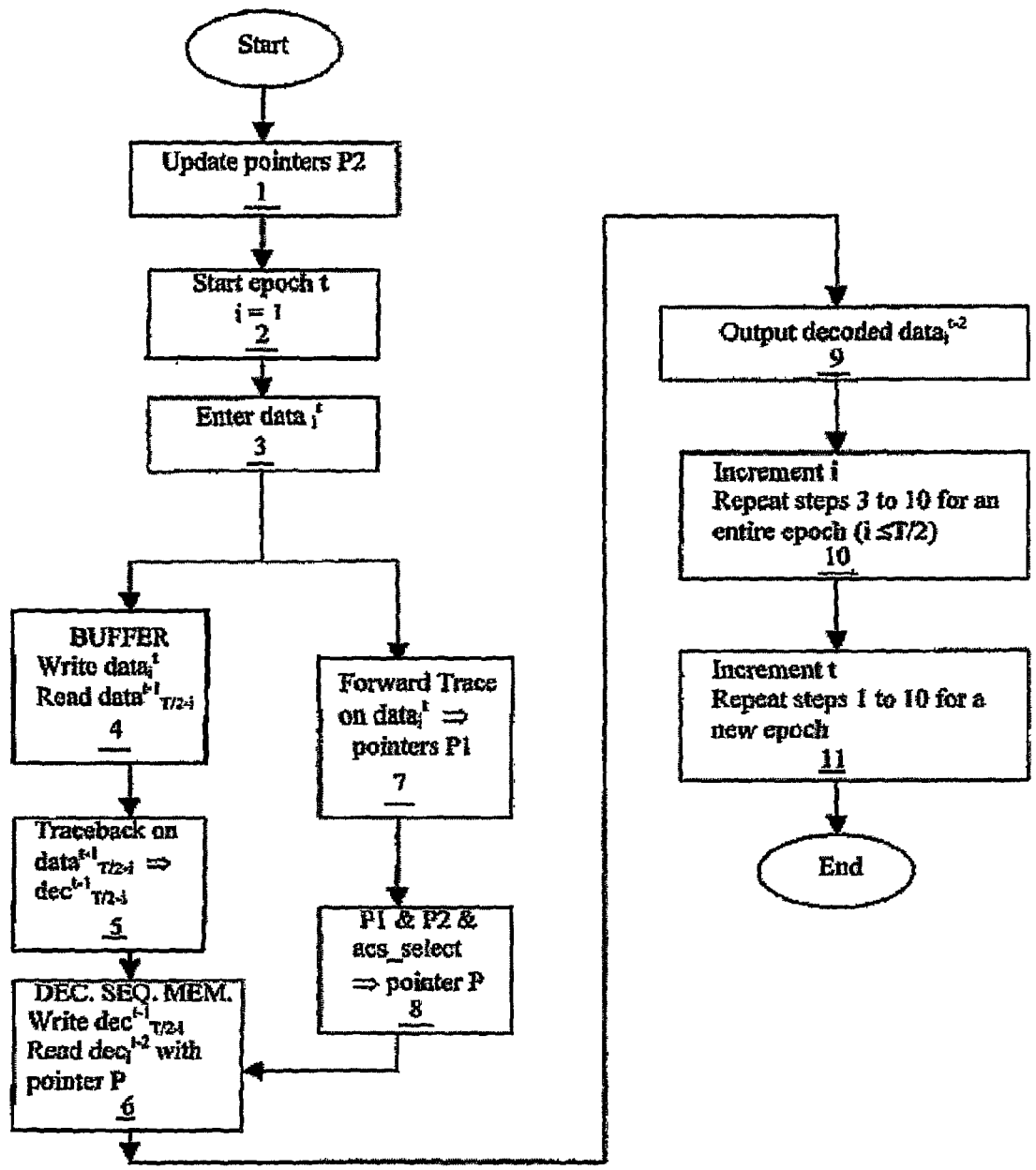
FIG. 3 is a flow chart of a memory management algorithm operating according to the principles of the present invention.

Referring also to FIG. 3, the data processing steps of the present invention can be appreciated. At step 1, prior to the start of each epoch, the values of the pointers P2 are updated with the data in the equivalent state pointers P1. After the new epoch starts at step 2, the current input data of step 3 is buffered at step 4 and forward traced at step 7. Concurrently data corresponding to a previous epoch is retrieved from the buffer and traced back to generate the decoded data at step 5. The decoded data is then written, at step 6, into the decoded sequence memory. The forward trace performed on the current data at step 7 determines the values of pointers P1. At step 8 the values of pointers P1 together with the stored values of pointers P2 and the minimum path state information from the ACS (acs_select) are used to generate the value of pointer P. Also at step 6 the value of pointer P is used to identify the decoded data from the two previous epochs associated with the minimum trellis path state, which is then retrieved from the decoded sequence memory. At step 9 the decoded data is forwarded to the next stage and at step 10 the process (steps 3 through 9) is repeated for the entire epoch. When the epoch is completed, step 11 restarts the algorithm (steps 1 through 10) for the next epoch.

Referring also to FIG. 4 the timing relationships resulting from the operation of the above algorithm can be understood. The forward trace operation processes complete epochs up to the data in epoch 2, as shown by cell 18. This permits decoding of data D1, that is, the data in epoch 1, which will become the decoded data DD1 from epoch 1 that is read in epoch 3 in cell 19. Therefore, before the first epoch decoded data DD1 is produced as an output from cell 19, two epochs have been fully processed, namely, epoch 2 by the forward trace (cell 18) and epoch 1 by the traceback (cell 20). When the forward trace is processing branch j (1<j<T/2) of epoch 3, pointer P1 will point from the present state to the beginning state of epoch 3, pointer P2 will point from the end to the beginning state of epoch 2, and the resultant pointer P will point from the present state to the beginning state of epoch 2. Simultaneously, the decoded data sequence DD1 (cell 19) is available at the multiplexer output 21. As pointers P1 and P progress through the epoch 3 forward trace (cell 22), the output of decoded data bits progresses through branches 1 to T/2. Therefore, the dimension of the survivor memory depth sliding window is a constant value of T, which is equal to the dimension from branch j of epoch 3 to branch j of epoch 1, where 1<j<T/2. In summary, the total memory size of T and the total latency of two epochs represent a reduction of 33% over the prior art APTFT memory management scheme at no additional control complexity.

The APTFT algorithm of the present invention attains advantages known to both traceback and register exchange algorithms. Therefore, it is useful to compare it with the prior art described in Architectural Tradeoffs for Survivor Sequence Memory Management in Viterbi Decoders by G. Feygin et al. published in the I.E.E.E. Transactions on Communications, vol. 41, no. 3, March, 1993.

Table 1 depicts some of the differences and similarities between the APTFT algorithm of the present invention and the prior art register exchange algorithm.

TABLE 1

| IMPROVED APTFT ALGORITHM | REGISTER EXCHANGE ALGORITHM |
|---|---|
| Survivor Memory Depth is equal to T | Survivor Memory Depth is equal to T |
| Latency is equal to T | Latency is equal to T |
| Memory size is equal to T * N | Memory size is equal to T * N |
| Memory is Random Access Memory | Memory is complex, dual port, plus a two-to-one multiplexer, plus the interconnections between individual memory elements |
| Memory read/write operations per trellis branch is equal to 2 * N | Memory read/write operations per trellis branch is equal to N * T |
| Power consumption is relatively small | Power consumption is relatively large |
| Additional control in the traceback/forward trace units | No additional control |

Both algorithms have the same latency and memory size for a similar survivor memory depth, which is not generally accomplished by previous traceback algorithms. The improved APTFT protocol requires additional control in the traceback unit 12 and forward trace unit 17, as represented by the need for 3*N+1 state pointers, although the relative complexity of each pointer is small. In contrast, the use of the register exchange algorithm introduces additional complexity in the memory required, with the need for a two to one multiplexer for each memory element and the interconnections between the memory elements. Further, the present invention reads and writes to only 2*N memory elements per trellis branch, whereas the register exchange algorithm must read and write to all N*T memory elements per trellis branch. This latter characteristic results in large power consumption for the register exchange system, which becomes a limitation as the code constraint length increases. The additional state pointers of the present invention represent an acceptable cost in exchange for the use of a simple random access memory and reduced power consumption. In summary, the present invention is competitive with the register exchange algorithm for small constraint length codes and becomes more efficient than the register exchange system as the constraint length of the code is increased.

Table 2 portrays some of the differences between the present invention and another traceback system, the so called k-pointer even algorithm, which is exemplary of the complexity and efficiency of typical prior art traceback systems. Another traceback technique known as the k-pointer odd algorithm is similar in complexity and efficiency and will not be explicitly addressed.

TABLE 2

| IMPROVED APTFT ALGORITHM | k-POINTER EVEN ALGORITHM |
|---|---|
| Survivor memory depth is equal to T | Survivor memory depth is equal to T |
| Latency is equal to T | Latency is equal to 2 * T * k/(k − 1) |
| Memory size is equal to T * N | Memory size is equal to 2 * T * N * k/(k − 1) |
| Number of state pointers is equal to 3 * N + 1 | Number of state pointers is equal to k |

The best latency and memory size achieved by the k-pointer even algorithm occurs as the value of k approaches T, being approximately twice the corresponding latency and memory size of the present invention. When k is at its smallest value of k=2, the latency and memory size of the k-pointer even algorithm is four times the corresponding values of the present invention. The present invention therefore offers a considerable advantage in memory use and latency parameters. These improvements are achieved at the expense of extra control requirements that take the form of additional trellis state update pointers, which ultimately represent a limitation for large constraint length codes.

Table 3 depicts some of the differences between the implementation of the present invention and the one-pointer algorithm of the prior art. The one-pointer algorithm is a small latency, small memory size traceback algorithm. Another traceback technique known as the even-hybrid algorithm is similar in complexity and efficiency and will not be explicitly addressed.

TABLE 3

| IMPROVED APTFT ALGORITHM | ONE-POINTER ALGORITHM |
|---|---|
| Survivor memory depth is equal to T | Survivor memory depth is equal to T |
| Latency is equal to T | Latency is equal to T * (k + 1)/(k − 1) |
| Memory size is equal to T * N | Memory size is equal to T * N * (k + 1/(k − 1) |
| Memory read/write operations for each trellis branch is equal to 2 * N | Memory read/write operations for each trellis branch is equal to (k + 1) * N |
| Speed of read/write controls is equal | Read control is k times faster than write control |
| Number of trellis state update pointers is 3 * N + 1 | Number of trellis state update pointers is 1 |

The best latency and memory size achieved by the one-pointer algorithm occurs as the value of k approaches the value of T, and is approximately equal to the latency and memory size of the present invention. When the value of k is smallest, at k=2, the latency and memory size of the one-pointer system is three times greater than that of the present invention. Thus the one-pointer algorithm approaches the performance of the present invention only when the value of k is large. An advantage of the one-pointer algorithm is its need for only one state pointer as compared to the 3*N+1 state pointers of the present invention. However, the need for a single pointer is achieved at the cost of a relatively more complex read/write control, because the read operations occur at a rate that is k times faster than the write operations. When the value of k is large, that is, when the value of k approaches the value of T, the number of memory read/write operations of the one-pointer algorithm approaches the number of such operations performed by the previously discussed register exchange system, resulting in a similarly large power consumption for the one-pointer system.

A generalized version of the original (prior art) APTFT system can be understood with reference to FIG. 1. The generalized embodiment derives its name from the definition of an epoch. Specifically, an epoch is not necessarily limited to a size equal to half of the memory depth, or T/2. Rather, an epoch may be generally defined as equal to T/q, where q is an integer having a value defined by the inequality 2<q<T.

In the case of the general epoch value of T/q, the original APTFT relationships depicted in FIG. 2 are modified in several ways. First, the size of buffer 15 is (T/q)*N instead of (T/2)*N. Second, the decoded sequence memory 13 receives the decoded data sequences from the all-path traceback unit 12, for all of the trellis states, and makes the decoded data available to multiplexer 14 after q epochs, rather than two epochs later. The q epoch delay requires the same memory size of T*N.

Figure 5:
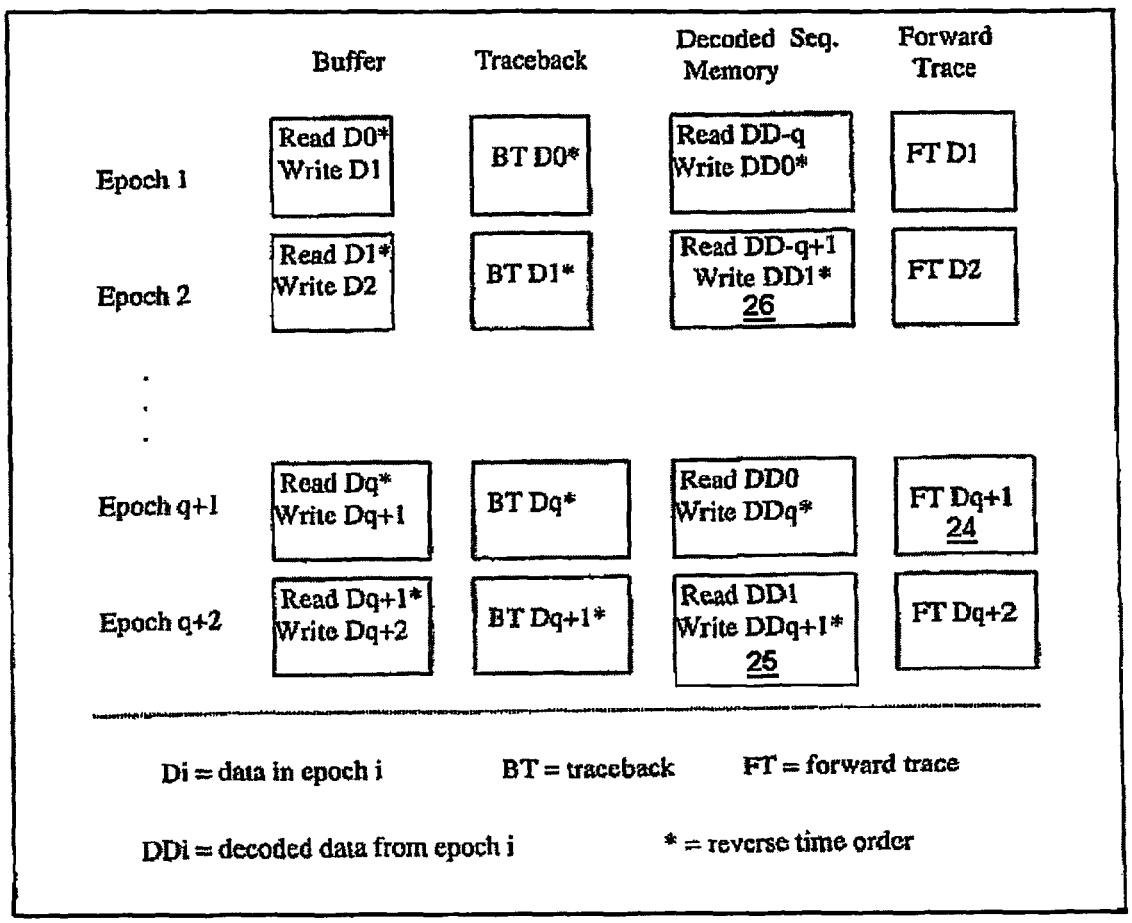
FIG. 5 is a timing diagram showing relationships of data being processed according to a generalized embodiment of the original APTFT system depicted in FIG. 1.

Reference to FIG. 5 will permit an understanding of the timing relationships that occur in the generalized original APTFT algorithm. The forward trace pointer, P, points to the minimum trellis path and provides the trellis state associated with the minimum path existing q epochs earlier, rather than two epochs earlier. The generalized design requires q internal pointers per trellis state in the forward trace, rather than two internal pointers, offset in time by intervals of one epoch. By the end of one epoch, each internal pointer P1, P2, . . . Pq, points to the beginning state of the corresponding epoch and trellis state path, and all internal pointers contribute to create the main pointer P. As seen in FIG. 5, the forward trace will process data up to Dq+1 (cell 24), in order to permit decoding of the data associated with D1, which therefore becomes DD1 (cell 26), the decoding occurring in epoch q+2 (cell 25). Therefore, q+1 epochs are fully processed (epochs 2 up to q+1 by the forward trace, and epoch 1 by the traceback) before the first epoch decoded data DD1 is provided as an output (cell 25). The first bit of any decoded sequence block DD is associated with a memory depth of (q+1)*T/q, and the last bit of the decoded sequence block is associated with a survivor memory depth of T.

As the data is processed by the generalized original APTFT processor, the memory size will consist of T/q*N in the buffer memory plus T*N in the decoded sequence memory, corresponding to a total memory size of (q+1)/q*T*N. Further, the generalized original APTFT algorithm needs a total of (q+1)*N+1 state pointers (N in the traceback unit and q*N+1 in the forward trace unit). There is a one epoch delay (T/q samples) in the buffer memory, plus a q epoch delay (T samples) in the decoded sequence memory, resulting in a total latency corresponding to a (q+1) epoch delay, or (q+1)*T/q samples.

In the generalized original APTFT algorithm, the memory size and latency decrease as q increases, at the cost of additional internal pointers in the forward trace unit. Depending on the system, an appropriate choice of q can be found which will minimize overall complexity, and for which the increase in the number of internal pointers is a small cost compared to the decrease in memory size and latency. This is generally true since the number of internal pointers is proportional to the constraint length, while the memory size grows exponentially with the constraint length. The optimum case as far as latency occurs when q is equal to T, resulting in a latency of T+1, which is the minimum possible for such a system. The memory size will then be (T+1)*N and the number of internal pointers will be (T+1)*N+1. In this case the epoch consists of just one sample and the buffer memory consists of N registers.

The generalized original APTFT technique can be advantageously applied to any trellis decoder system including one or more multiple decoders, decoders with either parallel or distributed data processing, serial or parallel multiple decoders, whether interleaved or not, and to any type of similar signal processing application.

A generalized embodiment of the improved APTFT system is also realized by redefining an epoch as being equal to T/q, where q is an integer having a value defined by the inequality 2<q<T. In the case of the generalized epoch value of T/q, the changes to the improved APTFT system include altering the size of buffer 15 from (T/2)*N to (T/q)*N. The decoded sequence memory 13 receives the decoded data sequences from the all-path traceback unit 12, for all of the trellis states, and makes the decoded data available to multiplexer 14 after q−1 epochs, rather than one epoch later. The q−1 epoch delay requires a memory size of (q−1)/q*T*N.

Reference to FIG. 6 will permit an understanding of the timing relationships that occur in the generalized improved APTFT system. The forward trace pointer, P, points to the minimum path and provides the trellis state associated with the minimum path existing q−1 epochs earlier, rather than one epoch earlier. The generalized design requires q internal pointers per trellis state in the forward trace unit, rather than two internal pointers, offset in time by intervals of one epoch. By the end of one epoch, each internal pointer P1, P2, . . . Pq, points to the beginning state of the corresponding epoch and state path, and all internal pointers contribute to create the main pointer P. All internal pointers except P1 are updated only at the end of an epoch, and their value remains unchanged during the following epoch. Pointer P1 is reset at the beginning of each epoch and is continuously updated throughout the forward trace.

As seen in FIG. 6, the forward trace will process complete epochs up to Dq (cell 28), in order to permit decoding of the data associated with D1, which therefore becomes DD1 (cell 29), the decoding occurring in epoch q+1 (cell 3). Therefore, q epochs are fully processed (epochs 2 up to q by the forward trace, and epoch 1 by the traceback) before the first epoch decoded data DD1 is provided as an output (cell 30). When the forward trace is processing branch j (1<j<T/2) of epoch q+1, pointer P1 will point from the present state to the beginning state of epoch q+1. Pointer P2 will point from the end to the beginning state of epoch q, pointer q will point from the end to the beginning state of epoch 2, and pointer P will point from the present state to the beginning state of epoch 2. At the same time, the decoded sequence DD1 is available at the multiplexer output 21. As pointers P1 and P progress through the epoch q+1 forward trace, the decoded output bits progress through branches 1 to T/2. Therefore, the dimension of the survivor memory depth sliding window is a constant value of T, which is equal to the dimension from branch j of epoch q+1 to branch j of epoch 1, where 1<j<T/2.

As the data is processed by the generalized improved APTFT processor, the memory size will consist of T/q*N in the buffer memory plus (q−1)/q*T*N in the decoded sequence memory, corresponding to a total memory size of T*N. Further, the generalized improved APTFT algorithm needs a total of (q+1)*N+1 state pointers (N in the traceback unit and q*N+1 in the forward trace unit). There is a one epoch delay (T/q samples) in the buffer memory, plus a (q−1) epoch delay ((q−1)*T/q samples) in the decoded sequence memory, resulting in a total latency corresponding to a q epoch delay, or T samples.

In the generalized improved APTFT algorithm, the memory size and latency remain constant as q increases, at the cost of additional internal pointers in the forward trace unit. Therefore, there is no cost advantage in increasing q beyond 2. However, although not optimal, the generalized improved algorithm for q>2 offers enough flexibility to satisfy different system requirements, which may incur from restrictions in memory size, for example.

The generalized improved APTFT technique can be advantageously applied to any trellis decoder system including one or more multiple decoders, decoders with either parallel or distributed data processing, serial or parallel multiple decoders, whether interleaved or not, and to any type of similar signal processing application.

What is claimed is:

1. In a system for processing data comprising groups of trellis encoded data packets, apparatus for providing trellis decoded data, comprising:

means for generating decision data associated with trellis state transitions in response to said encoded data packets;

a traceback network responsive to said decision data for identifying a sequence of antecedent trellis states, as determined by a state transition trellis, wherein said antecedent trellis states are identified for a sequence of data packets;

means for selecting a desired trellis state path from the antecedent trellis states;

means for continuously updating the desired trellis state path at each new trellis branch; and means responsive to said identified sequence of antecedent trellis states, for providing said trellis decoded data.

2. A system according to claim 1, wherein the traceback network further comprises:

means for performing an all-path traceback through the trellis; and means for performing an all-path forward trace through the trellis.

3. A system according to claim 2, further including means for continuously identifying the desired trellis state path at each new trellis branch with a forward trace pointer by identifying antecedent trellis states with said decision data.

4. A system according to claim 3, wherein the desired trellis state path is a minimum metric path among all trellis states.

5. A system according to claim 3, wherein the means for performing an all-path forward trace further comprises:

a first pointer for each trellis state path, the first pointer having a first pointer value, the first pointer value being updated at each new trellis branch throughout the duration of an epoch;

a second pointer for each trellis state path, the second pointer having a second pointer value, the second value being updated at an epoch boundary; and wherein each epoch is T/2, the traceback interval T defining a survivor memory depth of a decoded data sequence residing within a trellis encoded data sequence.

6. A system according to claim 5, wherein the forward trace pointer is continuously responsive to both the first pointer value and the second pointer value, the forward trace pointer thereby being continuously updated at each trellis branch during an epoch.

7. A system according to claim 6, wherein the second pointer is updated once at the end of each epoch with the value of the first pointer, and the first pointer is subsequently reset.

8. A system according to claim 7, wherein each decoded bit outputted by the system has an associated memory depth of T.

9. A system according to claim 8, wherein the forward trace pointer continuously identifies the desired trellis state path from two previous epochs at each new trellis branch.

10. A system according to claim 2, wherein the traceback network further comprises:

means for writing the input encoded data into a buffer memory unit in the order of data arrival for an epoch at a time;

means for reading the data from the buffer memory unit during the following epoch and sending it to the all-path traceback unit;

means for sending the decoded outputs from the all-path traceback unit to a decoded sequence memory unit as the all-path traceback unit traces back through the trellis with the data read from the buffer memory unit;

means for reading the decoded data from the decoded sequence memory unit in reverse order of arrival, one epoch at a time;

means for multiplexing the decoded data outputs from the decoded sequence memory unit in order to choose one of N decoded sequences, where N is the number of states in the trellis;

means for selecting a decoded data output sample from the decoded sequence memory via a multiplexer unit according to the value of the forward trace pointer.

11. A system according to claim 3, wherein the means for performing an all-path forward trace further comprises:

a first pointer, $P1$, for each trellis state path, the first pointer having a first pointer value, the first pointer value being updated during at each new trellis branch throughout the duration of an epoch;

additional $q-1$ pointers, $Pj$, $j=2, 3, \ldots, q$, for each trellis state path, the pointers having pointer values, each pointer value being updated at an epoch boundary; and wherein each epoch is a subinterval of the traceback interval T, with a duration of $T/q$, where q is an integer greater than or equal to two and q is less than or equal to T, and the traceback interval T defining a survivor memory depth of a decoded data sequence residing within a trellis encoded data sequence.

12. A system according to claim 11, wherein the forward trace pointer is continuously responsive to the values of all the q pointers, the forward trace pointer thereby being substantially continuously updated at each trellis branch during an epoch.

13. A system according to claim 12, wherein each pointer $Pj$, $j=3, \ldots, q$, is updated once at the end of each epoch with the value of the pointer $Pj-1$, the pointer $P2$ is updated once at the end of for each epoch with the value of the pointer $P1$ and the first pointer, $P1$, is subsequently reset.

14. A system according to claim 13, wherein each decoded bit residing within a sequence of data outputted by the system has an associated memory depth of T.

15. A system according to claim 14, wherein the forward trace pointer continuously identifies the desired trellis state path from q previous epochs at each new trellis branch.

16. In a system for processing data comprising groups of trellis encoded data jackets, a method comprising the steps of:

generating decision data associated with trellis state transitions in response to said data;

identifying a sequence of antecedent trellis states in accordance with a state transition trellis in response to said decision data;

selecting desired trellis state path in response to characteristics of each trellis branch;

continuously updating the desired trellis state oath at each new trellis branch; and providing said trellis decoded data in response to said identified sequence of antecedent trellis states.

17. A system according to claim 16, further comprising the step of updating desired trellis state path selections between epoch boundaries, wherein each epoch is T/2, the traceback interval T defining a survivor memory depth of a decoded data sequence residing within a trellis encoded data sequence.

18. A system according to claim 17, further comprising the step of updating and selecting a desired trellis state path at each new trellis branch throughout the duration of an epoch.

19. A system according to claim 18, further comprising the steps of:
identifying a plurality of trellis decoded data sequences and;
identifying one of the plurality of trellis decoded data sequences with a composite pointer updated at each new trellis branch throughout the duration of an epoch.

20. A system according to claim 19, further comprising the steps of:
identifying a plurality of trellis decoded data sequences with the help of a first pointer;
updating a value associated with the first pointer at each new trellis branch throughout the duration of an epoch;
identifying a plurality of trellis decoded data sequences with the help of a second pointer; and
updating a value associated with the composite pointer whenever the value associated with the first or the second pointer is updated.

21. A system according to claim 20, further comprising the step of replacing at each epoch boundary the value associated with the second pointer with the value associated with the first pointer and subsequently resetting the first pointer.

22. In a system for processing data comprising groups of trellis encoded data packets, apparatus for providing trellis decoded data, comprising:
means for generating decision data associated with trellis state transitions in response to said encoded data packets;
a traceback network responsive to said decision data for identifying a sequence of antecedent trellis states, as determined by a state transition trellis;
means for selecting a desired trellis state path from the antecedent trellis states;
means for continuously updating the desired trellis state path at each new trellis branch; and
means responsive to said identified sequence of antecedent trellis states, for providing said trellis decoded data;
wherein the traceback network further comprises:
means for performing an all-path traceback through the trellis; and
means for performing an all-path forward trace through the trellis;
wherein the means for performing an all-path forward trace further comprises:
a first pointer, P1, for each trellis state path, the first pointer having a first pointer value, the first pointer value being updated at each new trellis branch throughout the duration of an epoch;
additional q−1 pointers, Pj, j=2, 3, . . . , q, for each trellis state path, the pointers having pointer values, each pointer value being updated at an epoch boundary; and
wherein each epoch is a subinterval of the traceback interval T, with a duration of T/q, where q is an integer greater than or equal to two and q is less than or equal to T, and the traceback interval T defining a survivor memory depth of a decoded data sequence residing within a trellis encoded data sequence.

23. A system according to claim 22, wherein a composite forward trace pointer is responsive to the values of all the q pointers, the composite forward trace pointer being updated at each epoch boundary.

24. A system according to claim 23, wherein each pointer Pj, j=3, . . . , q, is updated once at the end of each epoch with the value of the pointer Pj−1, the pointer P2 is updated once at the end of for each epoch with the value of the pointer P1 and the first pointer, P1, is subsequently reset.

25. A trellis decoder having a plurality of trellis branches and trellis states for decoding encoded symbols, comprising:
means for generating decision data associated with trellis state transitions;
means for providing a plurality of trellis decoded data sequences by identifying a plurality of antecedent trellis state sequences with delayed decision data, as determined by a state transition trellis, the state transition trellis having N states;
means for identifying one of said plurality of trellis decoded data sequences with a pointer updated by identifying antecedent trellis states with said decision data, said pointer being continuously updated at each trellis branch throughout the epoch in response to data associated with each trellis branch, an epoch being subintervals of a traceback interval T.

26. In a system for processing data comprising groups of trellis encoded data packets, a method comprising the steps of:
generating decision data associated with trellis state transitions in response to said data;
identifying a sequence of antecedent trellis states in accordance with a state transition trellis in response to said decision data;
selecting desired trellis state path in response to characteristics of each trellis branch;
continuously updating the desired trellis state path at each new trellis branch; and
providing said trellis decoded data in response to said identified sequence of antecedent trellis states.

* * * * *

UNITED STATES PATENT AND TRADEMARK OFFICE
CERTIFICATE OF CORRECTION

PATENT NO. : 7,149,952 B2  Page 1 of 1
APPLICATION NO. : 10/511655
DATED : December 12, 2006
INVENTOR(S) : Ivonete Markman It is certified that error appears in the above-identified patent and that said Letters Patent is hereby corrected as shown below:

On the title page item (75), the correct inventor's name is: IVONETE MARKMAN

Signed and Sealed this

Nineteenth Day of June, 2007

JON W. DUDAS
*Director of the United States Patent and Trademark Office*